(12) United States Patent
Iikura et al.

(10) Patent No.: US 12,130,986 B2
(45) Date of Patent: Oct. 29, 2024

(54) CAPACITANCE DETECTION DEVICE AND INPUT DEVICE

(71) Applicant: Alps Alpine Co., Ltd., Tokyo (JP)

(72) Inventors: Akihisa Iikura, Miyagi-ken (JP); Tomoya Sasaki, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 139 days.

(21) Appl. No.: 17/980,332

(22) Filed: Nov. 3, 2022

(65) Prior Publication Data

US 2023/0058404 A1 Feb. 23, 2023

Related U.S. Application Data

(63) Continuation of application No. PCT/JP2021/015293, filed on Apr. 13, 2021.

(30) Foreign Application Priority Data

May 7, 2020 (JP) ................. 2020-081806

(51) Int. Cl.
*G06F 3/041* (2006.01)
*G01D 5/24* (2006.01)
*G06F 3/044* (2006.01)

(52) U.S. Cl.
CPC ............ *G06F 3/0418* (2013.01); *G01D 5/24* (2013.01); *G06F 3/044* (2013.01); *G06F 2203/04107* (2013.01)

(58) Field of Classification Search
None
See application file for complete search history.

(56) References Cited

U.S. PATENT DOCUMENTS

| | | | |
|---|---|---|---|
| 9,151,792 B1 | 10/2015 | Kremin et al. | |
| 10,817,114 B2 * | 10/2020 | Sasai | G01R 27/26 |
| 11,599,222 B2 * | 3/2023 | Fujiyoshi | B62D 1/046 |
| 11,983,362 B2 * | 5/2024 | Iikura | G06F 3/044 |

(Continued)

FOREIGN PATENT DOCUMENTS

| | | |
|---|---|---|
| JP | 2001/021519 | 1/2001 |
| JP | 2011/215124 | 3/2010 |

(Continued)

OTHER PUBLICATIONS

International Search Report for Application No. PCT/JP2021/015293, dated Apr. 13, 2021.

*Primary Examiner* — Jermele M Hollington
(74) *Attorney, Agent, or Firm* — Beyer Law Group LLP

(57) ABSTRACT

A capacitance detection device has: a first capacitor disposed in the path between a first node connected to a detection electrode and a second node; a second capacitor disposed in the path between the first node and the ground; a third capacitor disposed in the path between the first node and a third node connected to a shield electrode placed in proximity to the detection electrode; an alternating-current voltage output circuit that outputs a first alternating-current voltage to the third node; a first attenuation circuit that outputs a second alternating-current voltage resulting from attenuating the amplitude of the first alternating-current voltage; and a charge amplifier that supplies charge to the first capacitor through the second node and outputs a detection signal matching the supplied charge.

11 Claims, 4 Drawing Sheets

(56) References Cited

U.S. PATENT DOCUMENTS

| | | | |
|---|---|---|---|
| 12,019,109 B2 * | 6/2024 | Fujiyoshi | G06F 3/044 |
| 2011/0012863 A1 * | 1/2011 | Kobayashi | G06F 3/0443 |
| | | | 345/174 |
| 2013/0207677 A1 | 8/2013 | Togura | |
| 2016/0334902 A1 | 11/2016 | Li et al. | |
| 2017/0199598 A1 | 7/2017 | Fujiyoshi et al. | |
| 2019/0294297 A1 * | 9/2019 | Sasai | H03K 17/955 |
| 2019/0384457 A1 | 12/2019 | Fujiyoshi | |
| 2020/0225269 A1 | 7/2020 | Fujiyoshi et al. | |
| 2023/0229261 A1 * | 7/2023 | Iikura | G06F 3/04182 |
| | | | 345/174 |
| 2023/0408565 A1 * | 12/2023 | Sasai | G01R 35/005 |
| 2023/0418420 A1 * | 12/2023 | Sasaki | G06F 3/044 |
| 2024/0219210 A1 * | 7/2024 | Iikura | G06F 3/0418 |

FOREIGN PATENT DOCUMENTS

| | | |
|---|---|---|
| JP | 2019/66485 | 4/2019 |
| WO | 2012/043443 | 4/2012 |
| WO | 2016/059967 | 4/2016 |
| WO | 2018/116706 | 6/2018 |
| WO | 2018/159460 | 9/2018 |
| WO | 2019/069650 | 11/2020 |

* cited by examiner

CAPACITANCE DETECTION DEVICE AND INPUT DEVICE

CLAIM OF PRIORITY

This application is a Continuation of International Application No. PCT/JP2021/015293 filed on Apr. 13, 2021, which claims benefit of Japanese Patent Application No. 2020-081806 filed on May 7, 2020. The entire contents of each application noted above are hereby incorporated by reference.

BACKGROUND OF THE INVENTION

1. Field of the Invention

The present invention relates to a capacitance detection device and an input device.

2. Description of the Related Art

When a self-capacitance type of capacitive sensor detects a capacitance between a detection electrode and a target such as a finger, a parasitic capacitance between the detection electrode and an object other than the target causes error. In a known method of reducing this type of error, a shield electrode (also referred to as an active shield) that has the same potential as the detection electrode is placed around the detection electrode. In International Publication No. WO 2018/116706, a technology is described that further reduces the influence of the parasitic capacitance described above in a capacitance detection device having a shield electrode. Other related techniques are disclosed in, for example, International Publication No. WO 2016/059967, International Publication No. WO 2018/159460, International Publication No. WO 2019/069650, and Japanese Unexamined Patent Application Publication No. 2001-021519.

The shield electrode and detection electrode described above are placed close to each other. Therefore, a short-circuit state may be entered in which the shield electrode and detection electrode are short-circuited due to a manufacturing failure, deterioration caused by usage, or another reason. When a sensor unit (including the detection electrode and shield electrode), with which the target comes into contact, and an electronic circuit used to detect a capacitance are connected with a cable, an open state in which the sensor unit and electronic circuit are electrically disconnected may be entered due to the breakage of the cable. In the short-circuit state or open state described above, the detection result for the capacitance indicates an abnormal value. However, it is difficult to accurately determine the short-circuit state and open state only from the detection result for the capacitance. Although it is possible to provide a special circuit to determine the short-circuit state and open state, in which case the number of parts is increased, the structure becomes complex.

SUMMARY OF THE INVENTION

The present invention addresses the above situation by providing a capacitance detection device that can determine a short-circuit state and an open state with a simple structure and by providing an input device having this type of capacitance detection device.

A first aspect of the present invention is a capacitance detection device that detects a capacitance between a target and a detection electrode, the device having: a first capacitor disposed in the path between a first node connected to the detection electrode and a second node; a second capacitor disposed in the path between the first node and the ground; a third capacitor disposed in the path between the first node and a third node connected to a shield electrode placed in proximity to the detection electrode; an alternating-current voltage output circuit that outputs a first alternating-current voltage to the third node; a first attenuation circuit that outputs a second alternating-current voltage resulting from attenuating the amplitude of the first alternating-current voltage; and a charge amplifier that supplies charge to the first capacitor through the second node and outputs a detection signal matching the supplied charge. The charge amplifier supplies the charge to the first capacitor so that a voltage generated at the second node approaches the second alternating-current voltage.

According to this structure, in an open state in which at least one of the path between the detection electrode and the first node and the path between the shield electrode and the third node is electrically disconnected, a parasitic capacitance between the detection electrode and the shield electrode is not connected in parallel to the third capacitor. Therefore, a capacitance between the first node and the third node is reduced, the amplitude of an alternating-current voltage between the first node and the third node is increased, and the amplitude of an alternating-current voltage at the first node is reduced. In a short-circuit state in which the detection electrode and the shield electrode are short-circuited, the first node is electrically continuous to the third node, so the amplitude of the alternating-current voltage at the first node is increased until the amplitude becomes substantially equal to the amplitude of the first alternating-current voltage. That is, the amplitude of the alternating-current voltage at the first node is decreased in the open state and is increased in the short-circuit state.

Therefore, when the amount of charge accumulated in the first capacitor changes because the amplitude of the voltage of the first capacitor changes along with a change in the amplitude of the alternating-current voltage at the first node, the positive and negative signs for the direction of the change are reversed between the open state is and the short-circuit state. Since the detection signal matches the charge to be supplied from the charge amplifier to the first capacitor, when the sign of the change in the amount of charge accumulated in the first capacitor is reverse, the detection signal also changes in the reverse direction. Therefore, it becomes possible to determine the open state and the short-circuit state, on the basis that the detection signal changes in the reverse direction between the open state and the short-circuit state.

The charge amplifier preferably includes a feedback capacitor disposed in the path between the second node and a fourth node, to which the detection signal is output. The charge is preferably supplied from the feedback capacitor through the second node to the first capacitor. The first attenuation circuit preferably holds an attenuation ratio, which is the ratio of the amplitude of the second alternating-current voltage to the amplitude of the first alternating-current voltage, at a ratio at which the amplitude of the voltage of the detection signal becomes near zero in a non-detected state in which the target is not present.

In this structure, the amplitude of the voltage of the detection signal becomes near zero in the non-detected state in which the target is not present. The larger the capacitance (in the description below, the capacitance may be referred to as the capacitance eligible for detection) between the target and the detection electrode is, the larger the amplitude of the voltage of the detection signal becomes. Therefore, the range in which the voltage of the detection signal changes according to a change in the capacitance eligible for detection is widened. This makes it easy to enhance detection sensitivity for the capacitance eligible for detection.

When the amplitude of the voltage of the detection signal becomes near zero in the non-detected state, the amplitude of the voltage generated in the feedback capacitor becomes substantially equal to the amplitude of the second alternating-current voltage. At this time, the amplitude of the voltage generated in the first capacitor becomes substantially equal to the amplitude obtained by multiplying the amplitude of the second alternating-current voltage by a certain coefficient (a capacitance ratio between the first capacitor and the feedback capacitor). It will be assumed that in this non-detected state, the capacitance of the second capacitor is set to zero. Then, charge is not accumulated in the second capacitor, so the amplitude of the voltage at the first node becomes large. In this case, the amplitude of the voltage generated in the first capacitor becomes large and the amplitude of the voltage of the detection signal deviates from near zero. If the amplitude of the voltage of the detection signal deviates from near zero, as a method of making the amplitude approach zero, the amplitude of the second alternating-current voltage can be increased or the capacitance of the third capacitor can be decreased.

In the method of making the amplitude of the second alternating-current voltage large, the amplitude of the voltage at the second node is increased and approaches the amplitude of the voltage at the first node and the amplitude of the voltage generated in the first capacitor becomes small. However, when the amplitude of the voltage at the second node is increased, if the amplitude of the alternating-current voltage at the first node in the short-circuit state is increased until the amplitude becomes substantially equal to the amplitude of the first alternating-current voltage, a change in the amplitude of the voltage in the first capacitor due to this increase in the amplitude is suppressed. When the change in the amplitude of the voltage in the first capacitor is suppressed, a change in the amplitude of the voltage of the detection signal is suppressed. This makes it difficult to determine the short-circuit state from a change in the amplitude of the voltage of the detection signal. In the method of making the amplitude of the second alternating-current voltage large, the difference between the amplitude of the voltage at the second node (the amplitude of the second alternating-current voltage) and the amplitude of the voltage at the third node (the amplitude of the first alternating-current voltage) becomes small, so the difference between the amplitude of the voltage at the first node and the amplitude of the voltage at the third node (the amplitude of the first alternating-current voltage) also becomes small.

Therefore, when the capacitance between the first node and the third node is reduced in the open state, a change in the amplitude of the voltage (an increase in the amplitude of the voltage) between the first node and the third node is suppressed and a change in the amplitude of the voltage at the first capacitor is suppressed. When the change in the amplitude of the voltage at the first capacitor is suppressed, a change in the amplitude of the voltage of the detection signal is suppressed. This makes it difficult to determine the open state from a change in the amplitude of the voltage of the detection signal.

In the method of making the capacitance of the third capacitor small, the amplitude of the voltage at the first node becomes small and approaches the amplitude of the voltage at the second node, so the amplitude of the voltage generated in the first capacitor becomes small. However, when the capacitance of the third capacitor is made small, the influence of external noise transmitted from the detection electrode is likely to be received. This lowers resistance to noise.

Therefore, when the second capacitor having an appropriate capacitance is provided between the first node and the ground, it becomes possible to cause the amplitude of the voltage of the detection signal to greatly change when the short-circuit state or open state occurs while reducing the influence of external noise by making the capacitance of the third capacitor large. This makes it easy to accurately determine the short-circuit state and open state.

In the open state in which at least one of the path between the detection electrode and the first node and the path between the shield electrode and the third node is electrically disconnected, the amplitude of the voltage of the detection signal is preferably maximized. In the short-circuit state in which the detection electrode and the shield electrode are short-circuited, the amplitude of the voltage of the detection signal is preferably maximized and the phase of the voltage of the detection signal with respect to the phase of the first alternating-current voltage is preferably reversed when compared with the open state.

In this structure, it becomes possible to more accurately determine the open state and short-circuit state according to the amplitude of the voltage of the detection signal and to the phase of the voltage of the detection signal with respect to the phase of the first alternating-current voltage.

The first attenuation circuit preferably includes a series circuit of a fourth capacitor and a fifth capacitor. The alternating-current voltage output circuit preferably applies the first alternating-current voltage across both ends of the series circuit. The first attenuation circuit preferably outputs, as the second alternating-current voltage, an alternating-current voltage generated across both ends of the fifth capacitor.

In this structure, the first alternating-current voltage is applied to the series circuit of the fourth capacitor and the fifth capacitor and the second alternating-current voltage matching the first alternating-current voltage is generated in the fifth capacitor. Therefore, noise in the second alternating-current voltage becomes small when compared with a case in which an attenuator based on a resistor is used.

The capacitance of the fourth capacitor and the capacitance of the fifth capacitor are preferably set so that the amplitude of the voltage of the detection signal becomes near zero in the non-detected state.

In this structure, the attenuation ratio, which is the ratio of the amplitude of the second alternating-current voltage to the amplitude of the first alternating-current voltage, is determined according to the capacitance of the fourth capacitor and the capacitance of the fifth capacitor. The capacitance of the fourth capacitor and the capacitance of the fifth capacitor are set so that the attenuation ratio is obtained at which the amplitude of the detection signal becomes near zero in the non-detected state in which the target is not present.

The capacitance value of the fifth capacitor, the value being adjustable, is preferably adjusted so that the amplitude of the voltage of the detection signal becomes near zero in the non-detected state.

In this structure, the amplitude of the second alternating-current voltage is adjusted by adjusting the capacitance value of the fifth capacitor and, through this adjustment of the amplitude, the amplitude of the voltage of the detection signal becomes near zero in the non-detected state in which the target is not present.

The charge amplifier preferably has: an operational amplifier that amplifies the difference in voltage between the inverting input terminal and non-inverting input terminal of the charge amplifier, the inverting input terminal being connected to the second node, the second alternating-current voltage being applied to the non-inverting input terminal, and outputs the detection signal matching the amplified difference in voltage to the fourth node; and a feedback circuit disposed in the path between the fourth node and the second node. A subtraction circuit is preferably provided that subtracts a reference signal, which is equivalent to a signal output from the operational amplifier as the detection signal in the non-detected state in which the target is not present, from the detection signal.

In this structure, in the non-detected state in which the target is not present, the reference signal, which is equivalent to a signal output from the operational amplifier as the detection signal, is subtracted from the detection signal. The signal obtained as a result of this subtraction has an amplitude matching the capacitance eligible for detection, the amplitude being very small in the non-detected state. Therefore, the dynamic range of the detection signal corresponding to a change in the capacitance eligible for detection becomes larger. This improves detection sensitivity for the capacitance eligible for detection.

A second attenuation circuit is preferably provided that outputs, as the reference signal, an alternating-current voltage resulting from attenuating the amplitude of the first alternating-current voltage.

In this structure, since the reference signal subtracted from the detection signal in the subtraction circuit is a voltage resulting from attenuating the first alternating-current voltage, high correlation is found between the noise component included in the detection signal and the noise component included in the reference signal. Thus, the noise component of the signal obtained as an attenuation result in the subtraction circuit is reduced.

A first resistor is preferably provided in the path between the second node and the first capacitor. The feedback circuit preferably includes a feedback capacitor disposed in the path between the fourth node and the second node, as well as a feedback resistor connected in parallel to the feedback capacitor.

In this structure, since the feedback capacitor, first resistor, and operational amplifier constitute a low-pass filter, noise entered through the detection electrode can be attenuated. This can suppress a drop in detection precision.

A circuit board is preferably provided, on which the first node and the second node are disposed. The first capacitor, the second capacitor, and the third capacitor are mounted on the circuit board.

A second aspect of the present invention is an input device that accepts information matching the approach of a target. The input device has: a detection electrode, a capacitance between the target and the detection electrode changing according to the approach of the target; a shield electrode placed in proximity to the detection electrode; and the capacitance detection device, in the first aspect, that detects the capacitance between the target and the detection electrode.

According to the present invention, it is possible to provide a capacitance detection device that can determine a short-circuit state and an open state with a simple structure and to provide an input device having this type of a capacitance detection device.

DESCRIPTION OF THE PREFERRED EMBODIMENTS

Figure 1:
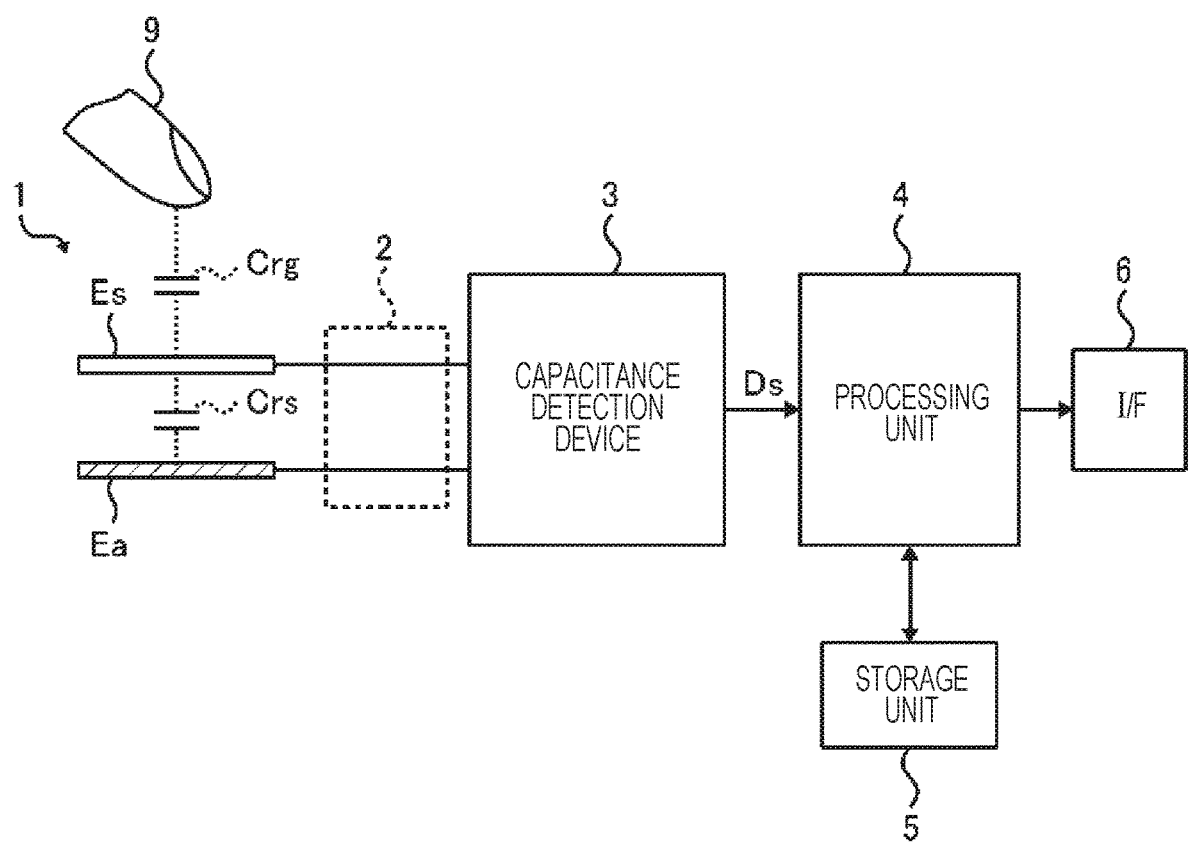
FIG. 1 illustrates an example of the structure of an input device according to an embodiment.

FIG. 1 illustrates an example of the structure of an input device according to an embodiment. The input device illustrated in FIG. 1 has a sensor unit 1, a cable 2, a capacitance detection device 3, a processing unit 4, a storage unit 5, and an interface unit 6.

The input device according to this embodiment detects, when a target 9 such as a finger or a pen approaches the sensor unit 1, a capacitance between the target 9 and a detection electrode Es provided in the sensor unit 1, and accepts information matching the approach of the target 9, according to this detection result. The input device acquires information as to whether the target 9 approaches the sensor unit 1 and information about the distance between the sensor unit 1 and the target 9, for example, according to the detection result for the capacitance. The input device is applied to, for example, a user interface device such as a touch sensor or a touch pad. The term "approach" and other similar terms in this description refer to closeness and do not impose any restriction on the presence or absence of a contact between objects that approach each other.

The sensor unit 1 has the detection electrode Es, which generates a capacitance between the detection electrode Es and the target 9 such a finger or pen, which is a conductor, and also has a shield electrode Ea placed in proximity to the detection electrode Es. The sensor unit 1 has a detection area in which the target 9 can approach the detection electrode Es. The front surface of the detection area is covered with, for example, an insulative cover layer. The detection electrode Es is placed on a lower layer side below the cover layer. The shield electrode Ea is an electrostatic shield used to prevent capacitive coupling between the detection electrode Es and an object other than the target 9. In the detection area, the shield electrode Ea is placed on a lower layer side below the detection electrode Es, for example.

As illustrated in FIG. 1, a capacitive component Crg, which is parasitic, is formed between the detection electrode Es and the target 9, and a capacitive component Crs, which is parasitic, is formed between the shield electrode Ea and the detection electrode Es. A capacitive component Csg, which is parasitic, is formed between the shield electrode Ea and the ground.

The capacitance detection device 3 detects the capacitance of the capacitive component Crg formed between the target 9 and the detection electrode Es (in the description below, the capacitance may be referred to as the capacitance Crg eligible for detection), and outputs a signal Ds indicating the detection result. The capacitance detection device 3 is connected to the detection electrode Es and shield electrode Ea in the sensor unit 1 through the cable 2.

The processing unit 4 is a circuit that controls overall operations of the input device. For example, the processing unit 4 includes one or more processors (central processing unit (CPU), digital signal processor (DSP), and the like) that perform processing matching operation code of programs stored in the storage unit 5. The processing unit 4 may also include special hardware (application-specific integrated circuit (ASIC), field-programmable gate array (FPGA), and the like) structured so as to fulfill particular functions. Processing by the processing unit 4 may be implemented by execution of operation code by processors or at least part of processing may be implemented by special hardware.

According to the signal Ds, indicating the detection result, output from the capacitance detection device 3, the processing unit 4 decides whether the target 9 is in proximity to the sensor unit 1, calculates the distance between the target 9 and the sensor unit 1, determines the open state and short-circuit state, which will be described later, and performs other processing. The sensor unit 1 may have a plurality of detection electrodes Es in FIG. 4 as in a variation, which will be described later and the capacitance detection device 3 may detect the capacitance Crg eligible for detection for each of the plurality of detection electrodes Es. In this case, the processing unit 4 may calculate the proximity distance of the target 9 in the detection area of the sensor unit 1 as well as the size of the target 9 and the like, according to the signal Ds obtained about each detection electrode Es.

The storage unit 5 stores programs including operation code executed by the processor in the processing unit 4, data used in processing in the processing unit 4, data temporarily held in a processing process, and the like. The storage unit 5 is structured by using one or more types of storage devices such as, for example, a dynamic random access memory (DRAM), a static random access memory (SRAM), a flash memory, and a hard disk drive.

The interface unit 6 is a circuit used to transmit and receive data between the input device and another device (a host controller of an electronic unit having an input device, for example). The processing unit 4 outputs information (the presence or absence of the target 9, the proximity position of the target 9, the distance to the target 9, the size of the target 9, and the like) obtained according to the detection result from the capacitance detection device 3 to a high-end device (not illustrated) through the interface unit 6. In the high-end device, a user interface is constructed that recognizes, for example, a pointing manipulation, a gesture manipulation, and the like by using the above information.

Figure 2:
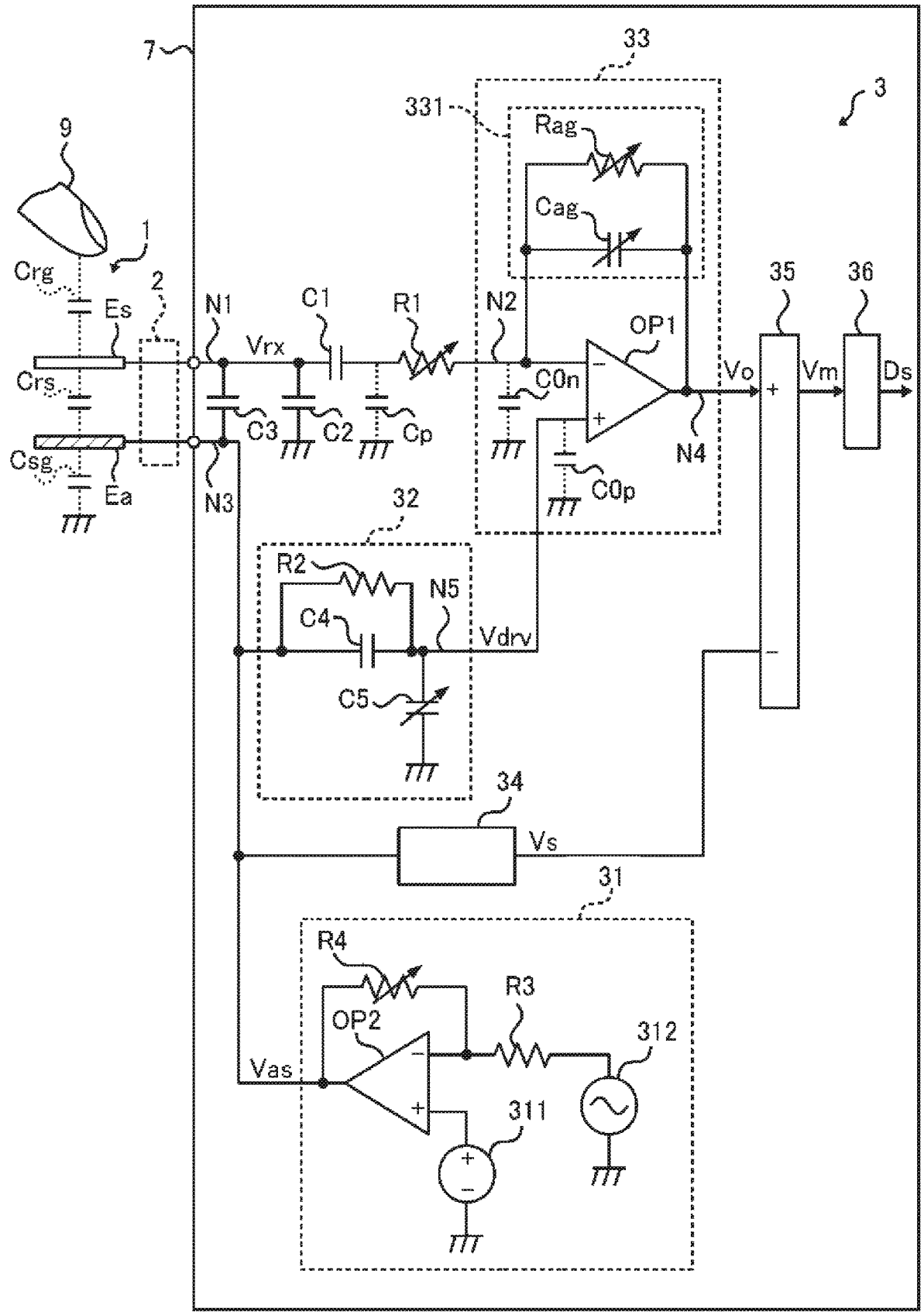
FIG. 2 illustrates an example of the structure of a capacitance detection device according to an embodiment.

Next, the structure of the capacitance detection device 3 will be described. FIG. 2 illustrates an example of the structure of the capacitance detection device 3 according to this embodiment. The capacitance detection device 3 illustrated in FIG. 2 has a first capacitor C1, a second capacitor C2, a third capacitor C3, a first resistor R1, an alternating-current voltage output circuit 31, a first attenuation circuit 32, a charge amplifier 33, a second attenuation circuit 34, a subtraction circuit 35, and a demodulation circuit 36.

The first capacitor C1 is disposed in the path between a first node N1 and a second node N2. The first node N1 is connected to the detection electrode Es through the cable 2. The second node N2 is connected to the charge amplifier 33. In the example in FIG. 2, the first resistor R1 is preferably disposed in the path between the second node N2 and the first capacitor C1. The second capacitor C2 is disposed in the path between the first node N1 and the ground. The third capacitor C3 is disposed in the path between a third node N3 and the first node N1. The third node N3 is connected to the shield electrode Ea through the cable 2.

The alternating-current voltage output circuit 31 outputs a first alternating-current voltage Vas to the third node N3. For example, the alternating-current voltage output circuit 31 outputs a sinusoidal first alternating-current voltage Vas having a constant amplitude and a constant frequency.

In the example in FIG. 2, the alternating-current voltage output circuit 31 includes a constant-voltage source 311, which outputs a direct-current voltage, an oscillator 312, which creates a sinusoidal oscillation signal having a predetermined frequency, an operational amplifier OP2, and resistors R3 and R4. A direct-current voltage from the constant-voltage source 311 is applied to the non-inverting input terminal of the operational amplifier OP2. An oscillation signal from the oscillator 312 is input to the inverting input terminal of the operational amplifier OP2 through the resistor R3. The resistor R4 is disposed in the path between the output terminal of the operational amplifier OP2 and its inverting input terminal. The output terminal of the operational amplifier OP2 is connected to the third node N3. The operational amplifier OP2 outputs the first alternating-current voltage Vas, which has a direct-current component matching the direct-current voltage of the constant-voltage source 311, from the output terminal to the third node N3. In the example in FIG. 2, the resistance value of the resistor R4, the value being adjustable, is adjusted so that the first alternating-current voltage Vas has a predetermined amplitude.

The first attenuation circuit 32 outputs a second alternating-current voltage Vdrv resulting from attenuating the amplitude of the first alternating-current voltage Vas output by the alternating-current voltage output circuit 31. The first attenuation circuit 32 preferably holds an attenuation ratio K, which is a ratio of the amplitude of the second alternating-current voltage Vdrv to the amplitude of the first alternating-current voltage Vas, at a ratio at which the amplitude of the voltage of a detection signal Vo, which will be described later, of the charge amplifier 33 becomes near zero in a non-detected state in which the target 9 is not present.

In the example in FIG. 2, the first attenuation circuit 32 preferably includes a fourth capacitor C4 and a fifth capacitor C5, which are connected to each other in series, and also includes a resistor R2 connected in parallel to the fourth capacitor C4. The alternating-current voltage output circuit 31 preferably applies the first alternating-current voltage Vas to a series circuit of the fourth capacitor C4 and fifth capacitor C5. One terminal of the fourth capacitor C4 is connected to the third node N3, and the other terminal of the fourth capacitor C4 is connected to the ground through the fifth capacitor C5. The first attenuation circuit 32 preferably outputs an alternating-current voltage generated in the fifth capacitor C5 as the second alternating-current voltage Vdrv. The fourth capacitor C4 and fifth capacitor C5 each preferably have a capacitance that is set so that the amplitude of the voltage of the detection signal Vo from the charge amplifier 33 becomes near zero in the non-detected state in which the target 9 is not present.

In the example in FIG. 2, the capacitance value of the fifth capacitor C5, the value being adjustable, is preferably adjusted so that the amplitude of the voltage of the detection signal Vo from the charge amplifier 33 becomes near zero in the non-detected state in which the target 9 is not present. The fifth capacitor C5 may be a part formed on a semiconductor chip or the like in an integrated circuit (IC). In this case, the fifth capacitor C5 is structured by a plurality of capacitors connected in parallel, and the capacitance value is adjusted by selecting the number of capacitors to be connected in parallel through laser trimming or the like. Also, the fifth capacitor C5 may be a discrete part the element value of which is adjustable.

A fifth node N5, to which the fourth capacitor C4 and fifth capacitor C5 are connected, is connected to the third node N3 through the resistor R2. An input terminal of the charge amplifier 33 (the non-inverting input terminal of an operational amplifier OP1 described later), to which the fifth node N5 is connected, has a sufficiently larger input impedance than the resistance value of the resistor R2, so the direct-current potential at the fifth node N5 is substantially the same as the direct-current potential at the third node N3. In the example in FIG. 2, the resistance value of the resistor R2 can be adjusted during manufacturing. By adjusting this resistance value, therefore, the phase of the second alternating-current voltage Vdrv can be adjusted with respect to the phase of the first alternating-current voltage Vas.

The charge amplifier 33 preferably supplies charge to the first capacitor C1 through the second node N2 and also outputs the detection signal Vo matching the supplied charge. The charge amplifier 33 supplies charge to the first capacitor C1 so that the voltage generated at the second node N2 approaches the second alternating-current voltage Vdrv.

In the example in FIG. 2, the charge amplifier 33 preferably has a feedback circuit 331 and the operational amplifier OP1. The operational amplifier OP1 preferably amplifies the difference in voltage between the inverting input terminal connected to the second node N2 and the non-inverting input terminal to which the second alternating-current voltage Vdrv is applied, and preferably outputs the detection signal Vo matching the amplified difference in voltage to a fourth node N4. The feedback circuit 331 is preferably disposed in the path between the fourth node N4 and the second node N2. In the example in FIG. 2, the feedback circuit 331 preferably includes a feedback capacitor Cag disposed in the path between the fourth node N4 and the second node N2, and also preferably includes a feedback resistor Rag connected in parallel to the feedback capacitor Cag.

In the example in FIG. 2, the capacitance value of the feedback capacitor Cag and the resistance value of the feedback resistor Rag are adjustable. When the values of these elements are adjusted, the differences in phase between the detection signal Vo and the first alternating-current voltage Vas and between the detection signal Vo and the second alternating-current voltage Vdrv and the gain of the amplitude of the detection signal Vo with respect to the capacitance value of the capacitance Crg eligible for detection are adjusted. The feedback capacitor Cag and feedback resistor Rag may be parts, in an IC, the element values of which can be adjusted through laser trimming or the like or may be discrete parts the element values of which are adjustable.

The subtraction circuit 35 preferably subtracts, from the detection signal Vo, a reference signal Vs, which is equivalent to a signal output from the operational amplifier OP1 as the detection signal Vo in the non-detected state in which the target 9 is not present, and outputs a signal Vm indicating the subtraction result. The subtraction circuit 35 includes, for example, a fully-differential amplifier and outputs the signal Vm indicating the subtraction result as a differential signal. The subtraction circuit 35 may have a function as a low-pass filter, which attenuates components with frequencies higher than a predetermined frequency band, to suppress aliasing, which accompanies AD conversion, in the demodulation circuit 36 disposed at a later stage.

The second attenuation circuit 34 preferably outputs, as the reference signal Vs, an alternating-current voltage resulting from attenuating the amplitude of the first alternating-current voltage Vas. For example, the second attenuation circuit 34 can adjust the ratio of the amplitude of the reference signal Vs to the amplitude of the first alternating-current voltage Vas. The ratio is adjusted so that the amplitude of the signal Vm output by the subtraction circuit 35 in the non-detected state in which the target 9 is not present becomes near zero.

The demodulation circuit 36 creates the signal Ds, which is the alternating-current component of the signal Vm output from the subtraction circuit 35, matching the amplitude of the alternating-current component with the same frequency as the first alternating-current voltage Vas. For example, the demodulation circuit 36 includes: an A/D converter, which converts the signal Vm output from the subtraction circuit 35 to a digital signal; a multiplier that multiplies the digital signal resulting from the conversion in the A/D converter by a signal with the same frequency as the first alternating-current voltage Vas; and a low-pass filter that removes an alternating-current component from a signal indicating the result of the multiplication by the multiplier and outputs the resulting signal as the signal Ds. Since the detection signal Vo has an amplitude matching the capacitance Crg eligible for detection as will be described later, the signal Ds matching the amplitude of the signal Vm with the same frequency as the first alternating-current voltage Vas has a value matching the capacitance Crg eligible for detection.

The electronic parts constituting the capacitance detection device 3 are mounted on a circuit board 7, on which the first node N1 and third node N3 connected to the cable 2 are disposed, as indicated in, for example, FIG. 2. The first capacitor C1, second capacitor C2, and third capacitor C3 may be mounted on the circuit board 7 as discrete parts or may be capacitors in an IC mounted on the circuit board 7.

Next, operations of the input device having the structure described above will be described. In the description below, it will be assumed that the reference characters C1 to C5 of capacitors represent their capacitances and the reference characters Vas, Vdrv, and Vo of alternating-current voltages represent their amplitudes.

Operation in the Normal State

When changes in the phases of alternating-current voltages due to the influence of the resistance value of the resistor R2, the input impedance of the operational amplifier OP1, and the like are not considered, the phases of the alternating-current voltages generated in the capacitors connected to the fifth node N5 can be regarded as being substantially the same. In this case, if the total of charges of the capacitors connected to the fifth node N5 is assumed to be stored, the following equation holds.

$$C4 \cdot (Vas - Vdrv) = C5 \cdot Vdrv + C0p \cdot Vdrv \qquad (1)$$

In equation (1), C0p indicates the capacitance of a capacitive component C0p, which is parasitic, formed between the ground and the non-inverting input terminal of the operational amplifier OP1. From equation (1), the attenuation ratio K of the first attenuation circuit 32 is represented as in the equation below.

$$Vdrv = K \cdot Vas \qquad (2\text{-}1)$$

$$K = \frac{C4}{C4 + C5 + C0p} \qquad (2\text{-}2)$$

When changes in the phases of alternating-current voltages due to the influence of the resistance value of the first resistor R1, the resistance value of the feedback resistor Rag, the input impedance of the operational amplifier OP1, and the like are not considered, the phases of the alternating-current voltages generated in the capacitors connected to the first node N1 can be regarded as being substantially the same. In this case, if the total of charges of the capacitors connected to the first node N1 is assumed to be stored, the following equation holds.

$$(Crg+C2) \cdot Vrx + (C3+Crs) \cdot (Vrx-Vas) = C1 \cdot (Vdrv-Vrx) \quad (3)$$

In equation (3), Vrx indicates the amplitude of an alternating-current voltage Vrx at the first node N1. From equation (3), the amplitude of the alternating-current voltage Vrx at the first node N1 is represented as in the equation below.

$$Vrx = \frac{C1 \cdot Vdrv + (C3+Crs) \cdot Vas}{Crg + C2 + C1 + C3 + Crs} \quad (4)$$

When equation (2-1) is applied to equation (4), the amplitude of the alternating-current voltage Vrx at the first node N1 is represented as in the equation below.

$$Vrx = \frac{K \cdot C1 + C3 + Crs}{Crg + C2 + C1 + C3 + Crs} \cdot Vas \quad (5)$$

Furthermore, when changes in the phases of alternating-current voltages due to the influence of the resistance value of the first resistor R1, the resistance value of the feedback resistor Rag, and the input impedance of the operational amplifier OP1 are not considered, the phases of the alternating-current voltages generated in the capacitors connected to the second node N2 can be regarded as being substantially the same. In this case, if the total of charges of the capacitors connected to the second node N2 is assumed to be stored, the following equation holds.

$$C1 \cdot (Vdrv-Vrx) + (Cp+C0n) \cdot Vdrv = Cag \cdot (Vo-Vdrv) \quad (6)$$

In equation (6), Cp indicates the capacitance of capacitive component Cp, which is parasitic, formed between the ground and the path from the first capacitor C1 to the first resistor R1, and C0n indicates the capacitance of a capacitive component C0n, which is parasitic, formed between the ground and the inverting terminal of the operational amplifier OP1. From equation (6), the amplitude of the voltage of the detection signal Vo is represented as in the equation below.

$$Vo = \left(1 + \frac{C1 + Cp + C0n}{Cag}\right) \cdot Vdrv - \frac{C1}{Cag} \cdot Vrx \quad (7)$$

In the non-detected state in which the target 9 is not present, the capacitance of the capacitive component Crg formed between the target 9 and the detection electrode Es becomes zero. When Crg in equation (5) is set to zero, the amplitude Vrx0 of the alternating-current voltage Vrx at the first node N1 in the non-detected state is represented as in the equation below.

$$Vrx0 = \frac{K \cdot C1 + C3 + Crs}{C2 + C1 + C3 + Crs} \cdot Vas \quad (8)$$

Since the attenuation ratio K of the first attenuation circuit 32 is set so that the amplitude of the voltage of the detection signal Vo becomes near zero in the non-detected state in which the target 9 is not present, the equation below holds.

$$Vo = \left(1 + \frac{C1 + Cp + C0n}{Cag}\right) \cdot Vdrv - \frac{C1}{Cag} \cdot Vrx0 = 0 \quad (9)$$

In the non-detected state in which the target 9 is not present, the amplitude of the voltage of the detection signal Vo becomes near zero as indicated in equation (9). When the target 9 approaches the detection electrode Es and the capacitance of the capacitive component Crg becomes large, the capacitance between the first node N1 and the ground becomes large. As seen from equation (5) as well, therefore, the amplitude of the alternating-current voltage Vrx at the first node N1 becomes small. When the amplitude of the alternating-current voltage Vrx becomes small, the amplitude of the voltage of the detection signal Vo becomes large, as seen from equation (7). If the amplitude of the voltage of the detection voltage Vo becomes large as a result of the amplitude of the alternating-current voltage Vrx being made small, the phase of the detection signal Vo becomes substantially the same as the phase of the first alternating-current voltage Vas.

Figure 3A:
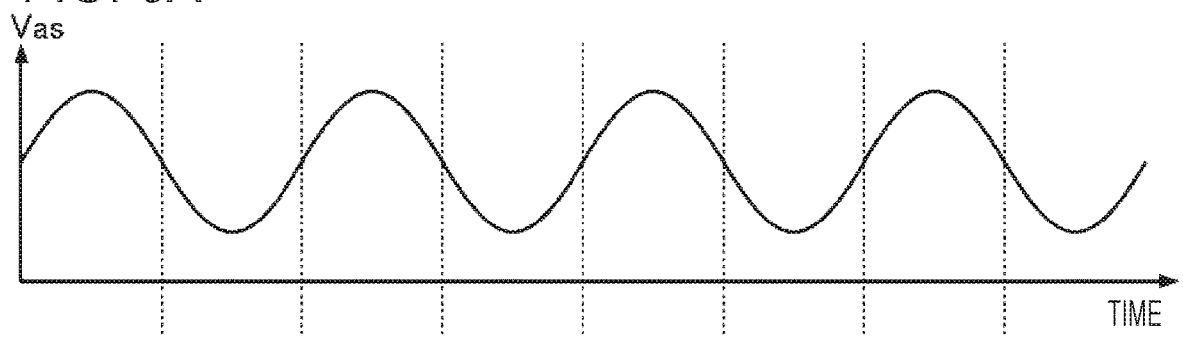
FIGS. 3A to 3D illustrate signal waveforms in individual portions in the capacitance detection device.
Figure 3B:
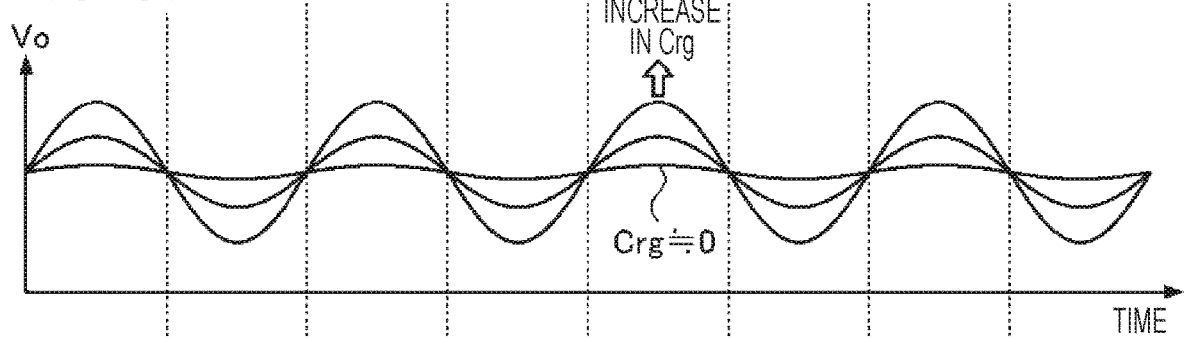

FIG. 3A indicates an example of the waveform of the first alternating-current voltage Vas, and FIG. 3B indicates an example of the voltage waveform of the detection signal Vo. As illustrated in FIG. 3B, when the capacitance of the capacitive component Crg is substantially zero in the non-detected state in which the target 9 is not present, the amplitude of the voltage of the detection signal Vo becomes near zero. When the capacitance of the capacitive component Crg becomes large along with the approach of the target 9, the amplitude of the voltage of the detection signal Vo, which has substantially the same phase as the first alternating-current voltage Vas, becomes large.

In the subtraction circuit 35, the signal Vm is created as a result of the subtraction of the reference signal Vs from the detection signal Vo. Since the detection signal Vo and reference signal Vs have substantially the same amplitude in the non-detected state, the amplitude of the signal Vm becomes near zero and the amplitude of the signal Vm becomes larger as the amplitude of the voltage of the detection signal Vo becomes large. In the demodulation circuit 36, the signal Ds is created that matches the amplitude of the alternating-current component of the signal Vm with the same frequency as the first alternating-current voltage Vas. The signal Ds has a value matching the amplitude of the voltage of the detection signal Vo, that is, a value matching the capacitance of the capacitive component Crg. According to the capacitance, indicated by the signal Ds, of the capacitive component Crg, the processing unit 4 decides whether the target 9 is in proximity to the sensor unit 1, calculates the distance between the target 9 and the sensor unit 1, determines the open state and short-circuit state, and performs other processing.

Operation in the Open State

A state in which at least one of the path between the detection electrode Es and the first node N1 and the path between the shield electrode Ea and the third node N3 is electrically disconnected will be referred to as the open state. If, for example, one or both of the wires of the cable 2 are disconnected or a contact failure occurs at an end of the cable 2 or another place, the open state is entered. In the open state, the capacitive component Crs, which is parasitic, formed between the detection electrode Es and the shield electrode Ea is not connected in parallel to the third capacitor C3 and the capacitive component Crg, which is parasitic, formed between the target 9 and the detection electrode Es is not also connected in parallel to the second capacitor C2.

It will be assumed that the capacitance of the capacitive component Crg formed between the target 9 and the detection electrode Es is sufficiently smaller than the capacitance of the capacitive component Crs formed between the detection electrode Es and the shield electrode Ea and is also sufficiently smaller than the capacitance of each of the first capacitor C1 to the third capacitor C3. Then, a change in the amplitude of the alternating-current voltage Vrx due to a shift to the open state is mainly caused by the change in the capacitance of the capacitive component Crs to zero, and the influence by the change in the capacitance of the capacitive component Crg can be ignored. In view of this, it is assumed that only the capacitance of the capacitive component Crs changes to zero. Then, the capacitance between the first node N1 and the third node N3 is reduced from C3+Crs to C3 and thereby the amplitude of the alternating-current voltage between the first node N1 and the third node N3 becomes large. Since the alternating-current voltage Vrx at the first node N1 and the alternating-current voltage (first alternating-current voltage Vas) at the third node N3 have substantially the same phase and the amplitude of the alternating-current voltage (first alternating-current voltage Vas) at the third node N3 remains unchanged, an increase in the amplitude of the alternating-current voltage between the first node N1 and the third node N3 is equivalent to a decrease in the amplitude of the alternating-current voltage Vrx between the first node N1 and the ground. That is, in the open state, the amplitude of the alternating-current voltage Vrx at the first node N1 becomes small.

The amplitude of the alternating-current voltage Vrx at the first node N1 in the open state will be denoted Vrx_opn. Then, when the capacitance of the capacitive component Crs and the capacitance of the capacitive component Crg are set to zero in equation (5), the amplitude Vrx_opn is represented as in the equation below.

$$\text{Vrx\_opn} = \frac{K \cdot C1 + C3}{C2 + C1 + C3} \cdot Vas \quad (10)$$

The alternating-current voltage Vrx indicated in equation (5) will be regarded as a function of Crs. Then, Crg+C2+C1+C3, which is the denominator in equation (5), is larger than K·C1+C3, which is the numerator, so the sign of the derived function obtained by differentiating the alternating-current voltage Vrx with respect to Crs is always positive. Therefore, when the value of Crs is decreased, the amplitude of the alternating-current voltage Vrx is monotonously decreased. If the capacitance of the capacitive component Crg is sufficiently small enough to be negligible, the amplitude Vrx_opn, indicated in equation (10), of the alternating-current voltage Vrx in the open state is substantially equal to the amplitude of the alternating-current voltage Vrx in equation (5) in which the value of Crs is reduced to zero, so the amplitude Vrx_opn is small when compared with the amplitude of the alternating-current voltage Vrx in the normal state. Therefore, from the relationship between equation (7) and equation (10) as well, it is understood that in the open state, the amplitude of the alternating-current voltage Vrx at the first node N1 becomes small.

The amplitude of the voltage of the detection signal Vo in the open state will be denoted Vo_opn. Then, when equation (10) is applied to equation (7), the amplitude Vo_opn is represented as in the equation below.

$$\text{Vo\_opn} = \left(1 + \frac{C1 + Cp + C0n}{Cag}\right) \cdot Vdrv - \frac{C1}{Cag} \cdot \text{Vrx\_opn} \quad (11)$$

Since Vrx_opn in equation (11) is smaller than Vrx in equation (7), the amplitude Vo_opn of the voltage of the detection signal Vo in the open state becomes larger on the positive side than in the normal state. That is, in the open state, the amplitude of the voltage of the detection signal Vo having the same phase as the first alternating-current voltage Vas becomes large.

Figure 3C:
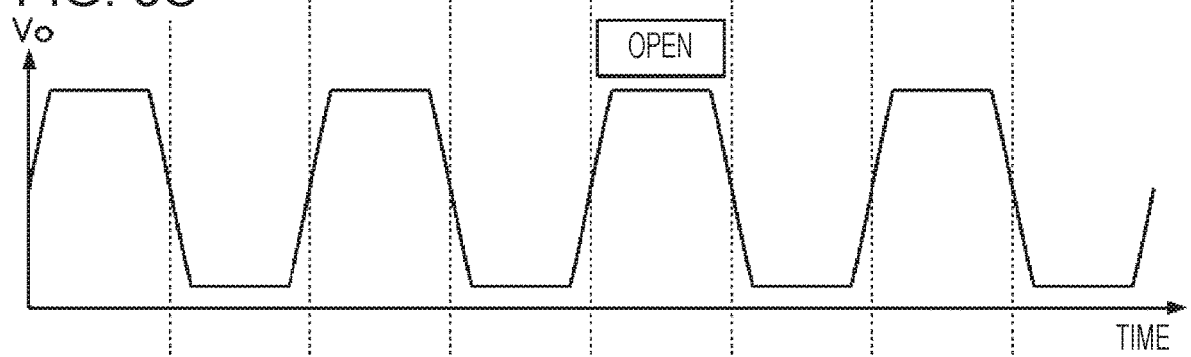

FIG. 3C illustrates an example of the voltage waveform of the detection signal Vo in the open state. In the example in FIG. 3C, the amplitude of the voltage of the detection signal Vo is preferably maximized. That is, the peaks of the voltage waveform of the detection signal Vo in the positive direction are limited to the maximum voltage and the peaks in the negative directions are limited to the minimum voltage. In the example in FIG. 3C, the voltage of the detection signal Vo has a waveform close to a trapezoidal waveform. The voltage of the detection signal Vo in the open state has substantially the same phase as the first alternating-current voltage Vas illustrated in FIG. 3A.

Operations in the Short-Circuit State

A state in which the detection electrode Es and shield electrode Ea are short-circuited will be referred to as the short-circuit state. The short-circuit state is entered when, for example, the detection electrode Es and shield electrode Ea come into contact with each other in the sensor unit 1 or when the wire led to the detection electrode Es and the wire led to the shield electrode Ea come into contact with each other in the cable 2. In the short-circuit state, the alternating-current voltage Vrx at the first node N1 becomes substantially the same as the first alternating-current voltage Vas. As seen from equation (5), the amplitude of the first alternating-current voltage Vas is larger than the amplitude of the alternating-current voltage Vrx at the first node N1 in the normal state. In the short-circuit state, therefore, the amplitude of the alternating-current voltage Vrx at the first node N1 becomes large, contrary to when the open state is entered.

The amplitude of the voltage of the detection signal Vo will be denoted Vo_sht. Then, when Vrx in equation (7) is replaced with Vas, the amplitude Vo_sht is represented as in the equation below.

$$\text{Vo\_sht} = \left(1 + \frac{C1 + Cp + C0n}{Cag}\right) \cdot Vdrv - \frac{C1}{Cag} \cdot Vas \quad (12)$$

Since in Vas in equation (12) is larger than Vrx in equation (5), the amplitude Vo_sht of the voltage of the detection signal Vo in the open state becomes larger on the negative side than in the normal state. That is, in the open state, the amplitude of the voltage of the detection signal Vo having a phase reverse to the phase of the first alternating-current voltage Vas becomes large.

Figure 3D:
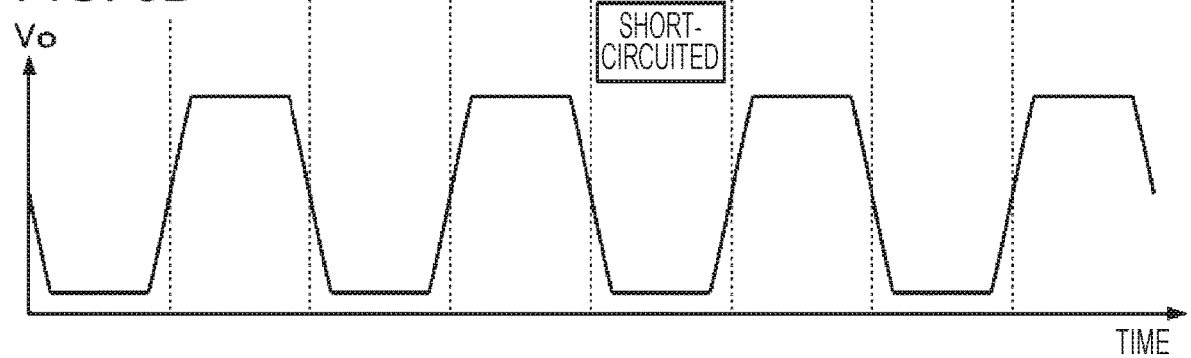

FIG. 3D illustrates an example of the voltage waveform of the detection signal Vo in the short-circuit state. In the example in FIG. 3D, the amplitude of the voltage of the detection signal Vo is preferably maximized. That is, the peaks of the voltage waveform of the detection signal Vo in the positive direction are preferably limited to the maximum voltage and the peaks in the negative directions are preferably limited to the minimum voltage, as with the voltage waveform, illustrated in FIG. 3C, in the open state. In the short-circuit state, however, the phase of the voltage of the detection signal Vo with respect to the first alternating-current voltage Vas is preferably reversed when compared with the open state. That is, the phase of the voltage of the detection signal Vo in the short-circuit state is preferably reverse to the phase of the first alternating-current voltage Vas illustrated in FIG. 3A.

Determination of the Open State and Short-Circuit State

As described above, the amplitude of the alternating-current voltage Vrx at the first node N1 is decreased in the open state and is increased in the short-circuit state. However, the amplitude of the alternating-current voltage at the second node N2 is the same as the amplitude of the second alternating-current voltage Vdrv, and thereby remains unchanged regardless of whether the open state or short-circuit state is entered. Therefore, when the amplitude of the alternating-current voltage Vrx at the first node N1 changes by ΔVrx, the amplitude (Vrx−Vdrv) of the alternating-current voltage generated in the first capacitor C1 also changes by ΔVrx.

If the change ΔVrx in the voltage in the first capacitor C1 occurs along with the change ΔVrx in the amplitude of the voltage of the alternating-current voltage Vrx at the first node N1, a change in the amount of charge accumulated in the first capacitor C1 is C1·ΔVrx. The sign of the change C1·ΔVrx in the amount of charge accumulated in the first capacitor C1 is reversed between when the change ΔVrx in the amplitude becomes negative because the open state is entered and when the change ΔVrx in the amplitude becomes positive because the short-circuit state is entered. Since the detection signal Vo is a signal matching charge supplied from the charge amplifier 33 to the first capacitor C1, if the sign of the change C1·ΔVrx in the amount of charge accumulated in the first capacitor C1 is reverse, the amplitude of the detection signal Vo also changes in the reverse direction.

From equation (7), a change, in the amplitude of the detection signal Vo, matching the change C1·ΔVrx in the amount of charge accumulated in the first capacitor C1 is −(C1/Cag)·ΔVrx. When the sign of ΔVrx is reversed, the sign of −(C1/Cag)·ΔVrx is also reversed. When the sign of −(C1/Cag)·ΔVrx is reversed, the amplitude of the detection signal Vo changes in the reverse direction. In the open state, the sign of ΔVrx becomes negative, so the amplitude of the detection signal Vo having the same phase as the first alternating-current voltage Vas is increased. In the short-circuit state, the sign of ΔVrx becomes positive, so the amplitude of the detection signal Vo having the same phase as the first alternating-current voltage Vas is decreased (in other words, the amplitude of the detection signal Vo having a phase opposite to the phase of the first alternating-current voltage Vas is increased). Therefore, when the amplitude of the detection signal Vo is maximum, the state can be determined to be the open state or short-circuit state. Furthermore, the open state and short-circuit state can be determined on the basis that the detection signal Vo changes in the reverse direction between the open state and the short-circuit state.

In this embodiment, when the ratio (C1/Cag) of the capacitance of the first capacitor C1 to the capacitance of the feedback capacitor Cag becomes large, the change −(C1/Cag)·ΔVrx, matching the change ΔVrx in the amplitude of the alternating-current voltage Vrx, in the amplitude of the detection signal Vo becomes large. When the change ΔVrx in the amplitude of the alternating-current voltage Vrx in the open state and short-circuit state is sufficiently larger than in the normal state, the amplitude of the detection signal Vo can be maximized only in the open state and short-circuit state by setting the ratio (C1/Cag) of the capacitance to an appropriate value. For example, the amplitude of the detection signal Vo can be maximized in the open state and short-circuit state as indicated in FIGS. 3C and 3D, and the amplitude of the detection signal Vo can be kept from being maximized in the normal state as in FIG. 3C.

As described above, in this embodiment, it is possible to maximize the amplitude of the detection signal Vo in the open state and short-circuit state and to reverse the phase of the detection signal Vo with respect to the first alternating-current voltage Vas between the open state and the short-circuit state. Therefore, the value of the signal Ds created in the demodulation circuit 36 in the open state and short-circuit state can be made to be a large value or small value that is impossible in the normal state, and the maximum difference can be taken between the value in the open state and the value in the short-circuit state.

For example, the value of the signal Ds can be taken as the maximum value in the open state and can be taken as the minimum value in the short-circuit state. Therefore, the processing unit 4, which processes the signal Ds as the capacitance of the capacitive component Crg, can determine the open state and short-circuit state according to the value of the signal Ds. For example, when the value of the signal Ds is equal to the maximum value or is larger than an upper limit threshold value, the processing unit 4 can determine the state to be the open state; when the value of the signal Ds is equal to the minimum value or is smaller than a lower limit threshold value, the processing unit 4 can determine the state to be the short-circuit state.

Effect of the Second Capacitor C2

As described above, the non-detected state in which the target 9 is not present, the attenuation ratio K of the first attenuation circuit 32 is set so that the amplitude of the voltage of the detection signal Vo becomes near zero. The voltage of the feedback capacitor Cag when the amplitude of the voltage of the detection signal Vo becomes near zero is substantially equal to the second alternating-current voltage Vdrv. When the capacitances, which are very small, of the capacitive components Cp and C0n are ignored, the amplitude of the voltage generated in the first capacitor C1 at this time is represented as in the equation below.

$$Vrx0 - Vdrv = \frac{Cag}{C1} \cdot Vdrv \quad (13)$$

As indicated in equation (13), the amplitude (Vrx−Vdrv) of the voltage generated in the first capacitor C1 becomes substantially equal to the amplitude obtained by multiplying the amplitude of the second alternating-current voltage Vdrv by a certain coefficient (Cag/C1).

In this non-detected state, it will be assumed that the capacitance of the second capacitor C2 is set to zero (this state may be referred to below as the assumed state). Since, in this assumed state, charge is not accumulated in the second capacitor C2, the amplitude of the alternating-current voltage Vrx at the first node N1 becomes large. When C2 in equation (8) is set to zero, the amplitude Vrx1 of the alternating-current voltage Vrx in the assumed state is represented as in the equation below.

$$Vrx1 = \frac{K \cdot C1 + C3 + Crs}{C1 + C3 + Crs} \cdot Vas \quad (14)$$

Since Vrx1 is larger than Vrx0, the equation below holds.

$$Vrx1 - Vdrv > \frac{Cag}{C1} \cdot Vdrv \qquad (15)$$

Since, in this assumed state, the amplitude of the voltage generated in the first capacitor C1 becomes too large to satisfy the conditions in equation (13), the amplitude of the voltage of the detection signal Vo deviates from near zero. If the amplitude of the voltage of the detection signal Vo deviates from near zero, as a method of making the amplitude approach zero (that is, a method of changing the inequality sign in equation (15) to an equal sign), the amplitude of the second alternating-current voltage Vdrv can be increased or the capacitance of the third capacitor C3 can be decreased.

In the method of making the amplitude of the second alternating-current voltage Vdrv large, the amplitude of the voltage at the second node N2 is increased and approaches the amplitude Vrx1 of the alternating-current voltage Vrx at the first node N1 and the amplitude (Vrx1−Vdrv) of the voltage generated in the first capacitor C1 becomes small. As seen from equation (2-1), making the amplitude of the second alternating-current voltage Vdrv large is equivalent to making the attenuation ratio K approach 1. As seen from equation (14), when the attenuation ratio K approaches 1, the amplitude Vrx1 of the alternating-current voltage Vrx at the first node N1 approaches the amplitude of the first alternating-current voltage Vas and the amplitude of the second alternating-current voltage Vdrv also approaches the amplitude of the first alternating-current voltage Vas. Therefore, the left side of equation (15) becomes small. When the amplitude of the second alternating-current voltage Vdrv is made large, the right side of equation (15) becomes large. When the amplitude of the second alternating-current voltage Vdrv is made large, therefore, the inequality sign in equation (15) can be changed to an equal sign, making it possible for the amplitude of the voltage of the detection signal Vo to have a near-zero value.

However, when the amplitude (Vdrv) of the alternating-current voltage at the second node N2 is increased, if, in the short-circuit state, the amplitude of the alternating-current voltage Vrx at the first node N1 is increased until the amplitude becomes substantially equal to the amplitude of the first alternating-current voltage Vas, a change (Vas−Vrx1) in the amplitude of the voltage in the first capacitor C1 due to this increase in the amplitude is suppressed. When the change (Vas−Vrx1) in the amplitude of the voltage in the first capacitor C1 is suppressed, a change in the amplitude of the voltage of the detection signal Vo is suppressed, so it becomes difficult to determine the short-circuit state from a change in the amplitude of the voltage of the detection signal Vo.

In the method of making the amplitude of the second alternating-current voltage Vdrv large, the difference between the amplitude (Vdrv) of the voltage at the second node N2 and the amplitude (Vas) of the voltage at the third node N3 becomes small, so the difference between the amplitude (vrx1) of the voltage at the first node N1 and the amplitude (Vas) of the voltage at the third node N3 also becomes small. Therefore, when the capacitance between the first node N1 and the third node N3 is reduced in the open state, a change (an increase in the amplitude of the voltage) in the amplitude of the voltage between the first node N1 and the third node N3 is suppressed and a change (a decrease in the amplitude of the voltage) in the amplitude of the voltage at the first node N1 is suppressed. This is also clear from the fact that when the attenuation ratio K approaches 1 in equation (14), a change in Vrx1 with respect to a change in Crs becomes small. When the change in the amplitude (Vrx1) of the voltage at the first node N1 is suppressed, a change in the amplitude of the voltage in the first capacitor C1 is suppressed and a change in the amplitude of the voltage of the detection signal Vo is suppressed, so it becomes difficult to determine the open state from a change in the amplitude of the voltage of the detection signal Vo.

As described above, in the method of making the amplitude of the second alternating-current voltage Vdrv large, a change in the amplitude of the voltage of the detection signal Vo when the open state is entered and when the short-circuit state is entered is suppressed. This makes it difficult to determine the open state and short-circuit state from a change in the amplitude of the voltage of the detection signal Vo.

In the method of making the capacitance of the third capacitor C3 small, the amplitude (Vrx1) of the voltage at the first node N1 becomes small as seen from equation (14). When the amplitude (Vrx1) of the voltage at the first node N1 becomes small and approaches the amplitude (Vdrv) of the voltage at the second node N2, the amplitude (Vrx1−Vdrv) of the voltage generated in the first capacitor C1 becomes small, so the inequality sign in equation (15) can be changed to an equal sign. However, when the capacitance of the third capacitor C3 is made small, the capacitance detection device 3 is likely to be affected by external noise transmitted from the detection electrode Es. This reduces resistance to noise.

Therefore, when the second capacitor C2 having an appropriate capacitance between the first node N1 and the ground is provided, it becomes possible to reduce the influence of external noise by making the capacitance of the third capacitor C3 large and to greatly change the amplitude of the voltage of the detection signal Vo when the short-circuit state or open state occurs. This makes it easy to accurately determine the short-circuit state and open state.

Next, a variation of the input device according to this embodiment will be described with reference to FIG. 4. In the input device illustrated in FIG. 4, the sensor unit 1 has a plurality of sets (in the description below, the set may be referred to as the detection electrode set), each of which is composed of the detection electrode Es and shield electrode Ea, which are placed in proximity. Each of the plurality of detection electrode sets (in the example in FIG. 4, four electrode sets) is connected to the capacitance detection device 3 through the cable 2. The input device in this variation may have other similar structural components (processing unit 4, storage unit 5, and interface unit 6) as in the input device illustrated in FIG. 1, besides the capacitance detection device 3 illustrated in FIG. 4.

Figure 4:
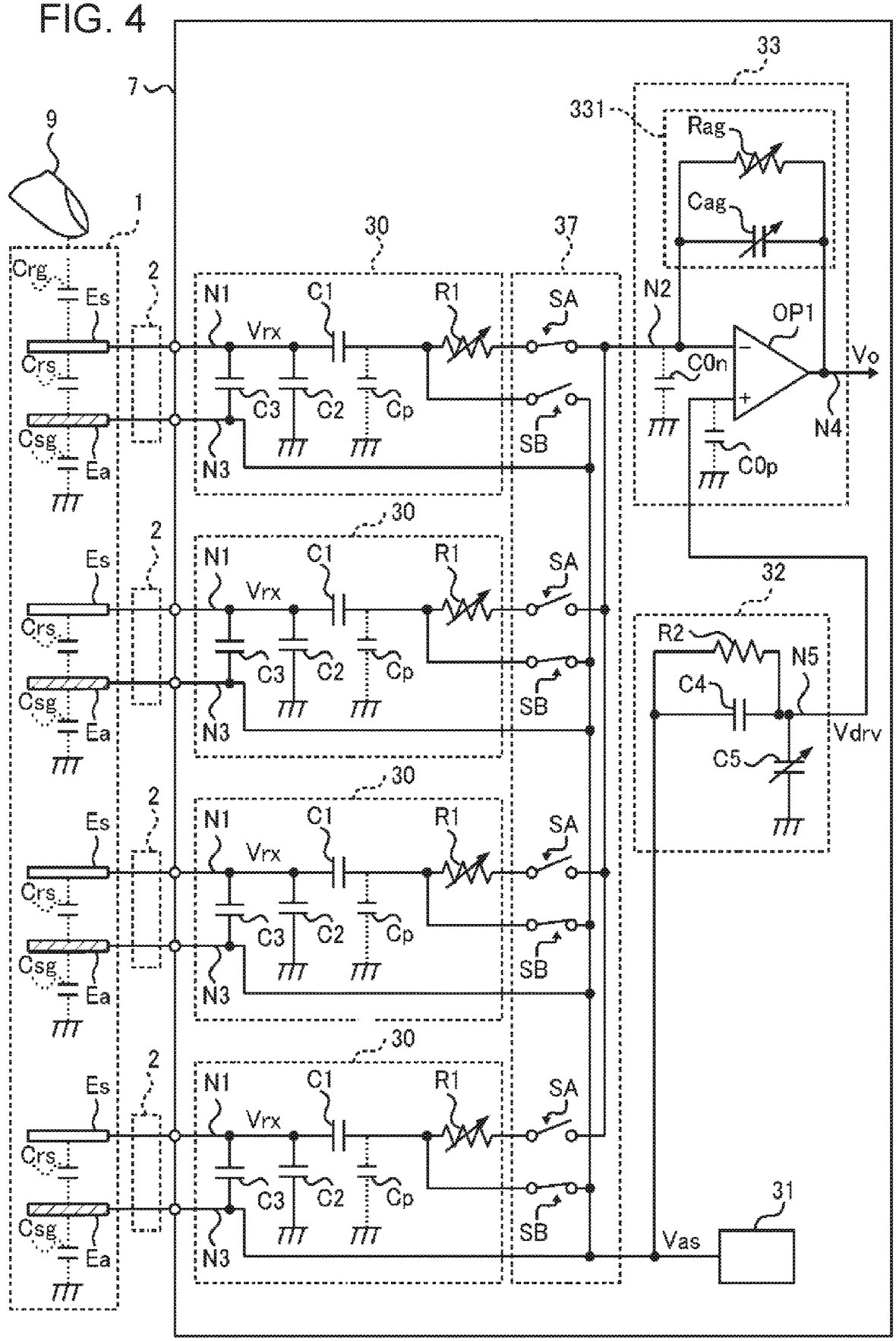
FIG. 4 illustrates a variation of the input device according to an embodiment.

In the input device illustrated in FIG. 4, the capacitance detection device 3 has a plurality of circuit blocks 30, each of which has a structure similar to a block composed of the first capacitor C1, second capacitor C2, third capacitor C3, and first resistor R1 in the capacitance detection device 3 illustrated in FIG. 2. The plurality of circuit blocks 30 (in the example in FIG. 4, four circuit blocks 30) are connected to the plurality of detection electrode sets in the sensor unit 1 through cables 2, in one-to-one correspondence. One detection electrode set (composed of the detection electrode Es and shield electrode Ea) and one circuit block 30 (C1 to C3 and R1) are similarly connected as in the capacitance detection device 3 illustrated in FIG. 2.

In the variation in FIG. 4, the capacitance detection device 3 further has a switch circuit 37 that connects one circuit block 30 selected from the plurality of circuit blocks 30 to the input terminal (second node N2) of the charge amplifier 33. In the example in FIG. 4, the switch circuit 37 includes a plurality of switches SA corresponding to the plurality of circuit blocks 30 as well as a plurality of switches SB corresponding to the plurality of circuit blocks 30. Each switch SA is disposed in the path between the second node N2 and the first resistor R1 included in the circuit block 30 corresponding to the switch SA. Each switch SB is disposed in the path between the third node N3 in the circuit block 30 corresponding to the switch SB and an intermediate node that connects the first resistor R1 and first capacitor C1, which are included in the circuit block 30.

The switch circuit 37 turns on only one switch SA of the plurality of switches SA and turns off the other switches SA. The switch circuit 37 turns off one switch SB connected to the circuit block 30 that includes the one switch SA in the turned-on state, and turns on the other switches SB. Thus, only the circuit block 30 connected to the switch SA in the turned-on state is connected to the input terminal (second node N2) of the charge amplifier 33, so a capacitance is detected only in the detection electrode set connected to this circuit block 30 through the cable 2. In the other circuit blocks 30 that are not connected to the input terminal (second node N2) of the charge amplifier 33, since the switch SB is turned on. In the other circuit blocks 30, therefore, the amplitude (Vas) of the voltage at the third node N3 and the amplitude (Vrx) of the voltage at the first node N1 become substantially equal. Thus, in the other circuit blocks 30 and the detection electrode sets connected to these circuit blocks 30, the amount of charge accumulated in the capacitors (C3 and Crs) connected between the first node N1 and the third node N3 is less likely to change. This can suppress generation of nose. Other structural components in the capacitance detection device 3 illustrated in FIG. 4 are similar as in the capacitance detection device 3 illustrated in FIG. 2.

In the input device in this variation as well, for each of a plurality of detection electrode sets and each of a plurality of cables 2, the open state and short-circuit state can be determined according to the detection signal Vo from the charge amplifier 33 as with the already-described input device.

CONCLUSION

According to this embodiment, the amplitude of the alternating-current voltage Vrx at the first node N1 changes in the reverse direction between when the open state is entered and when the short-circuit state is entered. When the amplitude of the alternating-current voltage Vrx changes in the reverse direction, the sign (positive or negative) of a change in the amount of charge accumulated in the first capacitor C1 is reversed when the amplitude of the voltage in the first capacitor C1 changes along with the change in the amplitude of the alternating-current voltage Vrx. Thus, the detection signal Vo changes in the reverse direction between when the open state is entered and when the short-circuit state is entered. Therefore, the open state and short-circuit state can be determined on the basis of the fact that the detection signal Vo changes in the reverse direction between the open state and the short-circuit state.

According to this embodiment, the amplitude of the voltage of the detection signal Vo becomes near zero in the non-detected state in which the target 9 is not present. The larger the capacitance Crg eligible for detection between the target 9 and the detection electrode Es is, the larger the amplitude of the voltage of the detection signal Vo becomes. Therefore, the range in which the voltage of the detection signal Vo changes according to a change in the capacitance Crg eligible for detection is widened. This makes it easy to enhance detection sensitivity for the capacitance Crg eligible for detection.

According to this embodiment, since the second capacitor C2 having an appropriate capacitance is provided between the first node N1 and the ground, it is possible to reduce the influence of external noise by making the capacitance of the third capacitor C3 large and to greatly change the amplitude of the voltage of the detection signal Vo when the short-circuit state or open state is entered, unlike a case in which the second capacitor C2 is not provided. Therefore, it becomes easy to determine these states.

According to this embodiment, the amplitude of the voltage of the detection signal Vo is maximized in the open state. In the short-circuit state, the amplitude of the voltage of the detection signal Vo is maximized and the phase of the voltage of the detection signal Vo with respect to the first alternating-current voltage Vas is reversed when compared with the open state. Therefore, the open state and short-circuit state can be more accurately determined according to the amplitude of the voltage of the detection signal Vo and to the phase of the voltage of the detection signal Vo with respect to the phase of the first alternating-current voltage Vas.

According to this embodiment, the first alternating-current voltage Vas is applied to a series circuit of the fourth capacitor C4 and fifth capacitor C5 and the second alternating-current voltage Vdrv matching the first alternating-current voltage Vas is generated in the fifth capacitor C5. Therefore, noise in the second alternating-current voltage Vdrv can be reduced when compared with a case in which an attenuator based on a resistor is used as the first attenuation circuit 32.

According to this embodiment, in the non-detected state in which the target 9 is not present, the reference signal Vs, which is equivalent to a signal output from the operational amplifier OP1 as the detection signal Vo, is subtracted from the detection signal Vo. The signal Vm resulting from this subtraction has an amplitude matching the capacitance Crg eligible for detection, the amplitude being very small in the non-detected state. Therefore, it is possible to more greatly increase the dynamic range of the detection signal Vo corresponding to a change in the capacitance Crg eligible for detection and to improve detection sensitivity for the capacitance Crg eligible for detection.

According to this embodiment, since the reference signal Vs subtracted from the detection signal Vo in the subtraction circuit 35 is a voltage resulting from attenuating the first alternating-current voltage Vas in the second attenuation circuit 34, high correlation is found between the noise component included in the detection signal Vo and the noise component included in the reference signal Vs. Thus, the noise component of the signal Vm obtained as a subtraction result in the subtraction circuit 35 can be reduced.

According to this embodiment, since the feedback capacitor Cag, first resistor R1, and operational amplifier OP1 constitute a low-pass filter, noise entered through the detection electrode Es can be attenuated. This can suppress a drop in detection precision.

The input device in the present invention is not limited to a user interface device that accepts information based on a manipulation by a finger or the like. That is, the input device in the present invention can be widely applied to devices that detect a capacitance between the detection electrode and any of various other objects, without being limited to the human body.

What is claimed is:

1. A capacitance detection device for detecting a capacitance between an object and a detection electrode, the device comprising:
    a first node connected to the detection electrode;
    a first capacitor disposed in a path between the first node and a second node;
    a second capacitor disposed in a path between the first node and ground;
    a third node connected to a shield electrode placed in proximity to the detection electrode;
    a third capacitor disposed in a path between the first node and the third node;
    an alternating-current voltage output circuit configured to output a first alternating-current voltage to the third node;
    a first attenuation circuit connected to the third node and configured to output a second alternating-current voltage by attenuating an amplitude of the first alternating-current voltage; and
    a charge amplifier connected to the first attenuation circuit and configured to supply an electric charge to the first capacitor through the second node such that a voltage generated at the second node approaches the second alternating-current voltage, the charge amplifier outputting a detection signal corresponding to the electric charge supplied to the first capacitor.

2. The capacitance detection device according to claim 1, wherein the detection signal is output to a fourth node, the charge amplifier including: a feedback capacitor disposed in a path between the second node and the fourth node, the electric charge being supplied from the feedback capacitor through the second node to the first capacitor,
    and wherein the first attenuation circuit is configured to hold an attenuation ratio, which is a ratio of an amplitude of the second alternating-current voltage to the amplitude of the first alternating-current voltage, at such a value that an amplitude of a voltage of the detection signal becomes approximately zero in a non-detected state in which no object for detection is present.

3. The capacitance detection device according to claim 2, wherein the detection signal has a maximum voltage amplitude, if at least one of a path between the detection electrode and the first node and a path between the shield electrode and the third node is electrically disconnected, which is referred to as an open state, or if the detection electrode and the shield electrode are short-circuited, which is referred to as a short-circuit state,
    and wherein the detection signal in the open state has a phase which is the same as a phase of the first alternating current voltage, while the detection signal in the short-circuit state has a phase which is opposite with respect to the phase of the first alternating-current voltage.

4. The capacitance detection device according to claim 2, wherein the first attenuation circuit includes a series circuit of a fourth capacitor and a fifth capacitor,
    wherein the alternating-current voltage output circuit is configured to apply the first alternating-current voltage across both ends of the series circuit, whereby the first attenuation circuit outputting, as the second alternating-current voltage, an alternating-current voltage generated across both ends of the fifth capacitor.

5. The capacitance detection device according to claim 4, wherein a capacitance of the fourth capacitor and a capacitance of the fifth capacitor are set such that the voltage amplitude of the detection signal becomes approximately zero in the non-detected state.

6. The capacitance detection device according to claim 5, wherein the fifth capacitor is a variable capacitor, a capacitance value of the fifth capacitor being adjusted such that the voltage amplitude of the detection signal becomes approximately zero in the non-detected state.

7. The capacitance detection device according to claim 1, wherein the charge amplifier includes:
    an operational amplifier configured to amplify a difference in voltage between an inverting input terminal and a non-inverting input terminal of the charge amplifier, thereby outputting the detection signal corresponding to the amplified difference to a fourth node, the inverting input terminal being connected to the second node, while the non-inverting input terminal being supplied with the second alternating-current voltage; and
    a feedback circuit disposed in a path between the fourth node and the second node,
    and wherein the capacitance detection device further comprises:
    a subtraction circuit configured to subtract a reference signal from the detection signal, the reference signal being equivalent to a signal output from the operational amplifier as the detection signal in the non-detected state.

8. The capacitance detection device according to claim 7, further comprising:
    a second attenuation circuit configured to output, as the reference signal, an alternating-current voltage by attenuating the amplitude of the first alternating-current voltage.

9. The capacitance detection device according to claim 7, further comprising a first resistor disposed in a path between the second node and the first capacitor,
    wherein the feedback circuit includes:
    a feedback capacitor disposed in a path between the fourth node and the second node; and
    a feedback resistor connected in parallel to the feedback capacitor.

10. The capacitance detection device according to claim 1, further comprising a circuit board, on which the first node and the second node are disposed,
    wherein the first capacitor, the second capacitor, and the third capacitor are mounted on the circuit board.

11. An input device for inputting information corresponding to an approach of the object, the input device comprising:
    the capacitance detection device according to claim 1;
    the detection electrode, a capacitance being formed between the detection electrode and the object approaching thereto; and
    the shield electrode placed in proximity to the detection electrode,
    wherein the capacitance detection device detects the capacitance between the object and the detection electrode which changes in accordance with a degree of the approach of the object.

* * * * *